United States Patent
Chen et al.

(10) Patent No.: US 9,595,473 B2
(45) Date of Patent: Mar. 14, 2017

(54) CRITICAL DIMENSION SHRINK THROUGH SELECTIVE METAL GROWTH ON METAL HARDMASK SIDEWALLS

(71) Applicant: International Business Machines Corporation, Armonk, NY (US)

(72) Inventors: Hsueh-Chung H. Chen, Cohoes, NY (US); Hong He, Schenectady, NY (US); Juntao Li, Cohoes, NY (US); Chih-Chao Yang, Glenmont, NY (US); Yunpeng Yin, Niskayuna, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/727,132

(22) Filed: Jun. 1, 2015

(65) Prior Publication Data
US 2016/0351447 A1 Dec. 1, 2016

(51) Int. Cl.
*H01L 21/768* (2006.01)
*H01L 23/522* (2006.01)
*H01L 23/532* (2006.01)

(52) U.S. Cl.
CPC .... *H01L 21/76897* (2013.01); *H01L 21/7684* (2013.01); *H01L 21/76807* (2013.01);
(Continued)

(58) Field of Classification Search
CPC ........... H01L 21/76897; H01L 21/7684; H01L 23/53238; H01L 21/76883; H01L 23/5226; H01L 21/76807; H01L 21/76834
(Continued)

(56) References Cited

U.S. PATENT DOCUMENTS 5,585,673 A 12/1996 Joshi et al.
5,695,810 A 12/1997 Dubin et al.
(Continued)

OTHER PUBLICATIONS

Goldfarb, Dario L., et al.; "Fabrication of Dual Damascene BEOL Structures Using a Multi-Level Multiple Exposure (MLME) Scheme—Part 1. Lithographic Patterning"; Proc. of SPIE; vol. 7639; p. 763901-1-736901-13; 2010.
(Continued)

*Primary Examiner* — Fernando L Toledo
*Assistant Examiner* — Adam S Bowen
(74) *Attorney, Agent, or Firm* — Cantor Colburn LLP; Vazken Alexanian (57) ABSTRACT

A method for fabricating a self-aligned via structure includes forming a tri-layer mask on an ILD layer over a lower metal wiring layer, the tri-layer mask includes first and second insulating layers and a metal layer in between the insulating layers; defining a trench pattern through the first insulating layer and metal layer, the trench pattern having a first width; defining a first via pattern in a lithographic mask over the trench pattern, the first via pattern having a second width that is larger than the first width; growing a metal capping layer on an exposed sidewall of the trench pattern to decrease the first width to a third width that defines a second via pattern; transferring the trench pattern into the ILD layer to form a trench; and transferring the second via pattern through the ILD layer and into the metal wiring layer to form a via.

15 Claims, 5 Drawing Sheets (52) U.S. Cl.
CPC .. *H01L 21/76834* (2013.01); *H01L 21/76883* (2013.01); *H01L 23/5226* (2013.01); *H01L 23/53238* (2013.01)

(58) Field of Classification Search
USPC .......................................................... 257/774
See application file for complete search history.

(56) References Cited

U.S. PATENT DOCUMENTS

| | | |
|---|---|---|
| 6,323,554 B1 | 11/2001 | Joshi et al. |
| 6,342,733 B1 | 1/2002 | Hu et al. |
| 6,486,059 B2 | 11/2002 | Lee et al. |
| 6,706,625 B1 | 3/2004 | Sudijono et al. |
| 6,975,032 B2 | 12/2005 | Chen et al. |
| 6,978,032 B2 | 12/2005 | Ogura et al. |
| 7,348,281 B2 | 3/2008 | Brakensiek et al. |
| 7,696,085 B2 | 4/2010 | Li et al. |
| 2004/0113279 A1 | 6/2004 | Chen et al. |
| 2010/0314767 A1* | 12/2010 | Chen .................. H01L 21/4846 257/759 |
| 2013/0270709 A1* | 10/2013 | Tseng ................. H01L 21/0337 257/774 |
| 2013/0337650 A1* | 12/2013 | Lee ...................... H01L 21/302 438/702 |

OTHER PUBLICATIONS

Harrer, Stefan, et al.; "Fabrication of Dual Damascene BEOL Structures Using a Multi-Level Multiple Exposure (MLME) Scheme—Part 2. RIE-Based Pattern Transfer and Completion of Dual Damascene Process Yielding an Electrically Functional Via Chain"; Proc. of SPIE; vol. 7639; p. 736919-1-763919-12; 2010.
Chen, Hsueh-Chung H., et al.; "Critical Dimension Shrink Through Selective Metal Growth on Metal Hardmask Sidewalls"; U.S. Appl. No. 15/086,440, filed Mar. 31, 2016.
List of IBM Patents or Patent Applications Treated as Related—Date Filed: Aug. 3, 2016; 2 pages.

* cited by examiner

CRITICAL DIMENSION SHRINK THROUGH SELECTIVE METAL GROWTH ON METAL HARDMASK SIDEWALLS

BACKGROUND

The present disclosure generally relates to semiconductor device processing, and more specifically, to dual damascene structures.

Copper-based chips are semiconductor integrated circuits that use copper for interconnections. Chips using copper interconnects can have smaller metal components than chips that use aluminum interconnects because copper is a better conductor than aluminum. Copper-based chips also use less energy to pass electricity through them.

Copper-based chips are patterned using additive patterning, also called damascene processing or dual damascene processing. In damascene processing, generally, the underlying silicon oxide insulating layer is patterned with open trenches where the conductor should be. A thick coating of copper that overfills the trenches is deposited on the silicon oxide. Chemical-mechanical planarization (CMP) is used to remove the copper that extends above the top of the insulating layer. Copper remaining within the trenches of the silicon oxide layer is not removed and becomes the patterned conductor.

Damascene processes generally form and fill a single feature with copper per damascene stage. Dual damascene processes generally form and fill two features with copper at once, e.g., a trench overlying a via in a dielectric material may both be filled with a single copper deposition using dual-damascene processing. In integrated circuits, a via is a small opening in the dielectric layer that allows a conductive connection between two metal layers.

SUMMARY

In one embodiment of the present disclosure, a method for fabricating a self-aligned via structure includes forming a tri-layer mask on an inter-level dielectric (ILD) layer, the ILD layer disposed over a lower metal wiring layer, and the tri-layer mask including a first insulating layer, a second insulating layer, and a metal layer disposed between the first and second insulating layers; defining a trench pattern through the first insulating layer and the metal layer of the tri-layer mask, the trench pattern having a first width; defining a first via pattern in a lithographic mask over the trench pattern in the tri-layer mask, the first via pattern having a second width, and the second width being larger than the first width; growing a metal capping layer on an exposed sidewall of the trench pattern to decrease the first width of the trench pattern to a third width, the third width defining a second via pattern; transferring the trench pattern into the ILD layer to form a trench; and transferring the second via pattern through the ILD layer and into the metal wiring layer to form a via.

In another embodiment, a method for fabricating a self-aligned via structure includes forming a tri-layer hard mask on an ILD layer, the ILD layer is disposed over a metal wiring layer, and the tri-layer hard mask includes a first insulating layer, a second insulating layer, and a metal layer disposed between the first and second insulating layers; forming a lithographic mask on the tri-layer hard mask; defining a trench pattern through the first insulating layer and the metal layer of the tri-layer mask, the trench pattern having a first width; defining a first via pattern in the lithographic mask over the trench, the first via pattern having a second width, and the second width being larger than the first width; growing a metal capping layer selectively on a portion of the metal layer within the trench pattern to decrease the first width to a third width, the third width defining a second via pattern; transferring the trench pattern into the ILD layer to form a trench; and transferring the second via pattern through the ILD layer and into the metal wiring layer to form a via.

Yet, in another embodiment, a self-aligned via structure includes a ILD layer disposed over a metal wiring layer; a trench extending through the ILD layer, the trench being substantially parallel to the metal wiring layer and having a first width; a via extending through the ILD layer and into the metal wiring layer, the via oriented substantially perpendicular to the trench and having a second width; wherein the second width of the via is smaller than the first width of the trench.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIGS. 1A-5B are a series of cross-sectional and top views illustrating a method of selectively forming metal sidewalls on via structures in accordance with an exemplary embodiment, in which:

DETAILED DESCRIPTION

Various lithography methods are used for defining via holes. For sub-80 nanometer (nm) back end of line (BEOL) dual damascene structures, 193 nm immersion single exposure lithography is reaching its limit for defining vias with suitable critical dimensions (CD). Using 193 nm immersion processes, via CDs are limited to about 60 nm.

Negative tone development (NTD) via lithography can theoretically print vias with CDs of about 50 nm, but with a staggered pitch size no smaller than 80 nm. Although NTD double exposure double etch (DEDE) via lithography can reduce the staggered via-to-via pitch size, for example, to about 50-60 nm, via CDs of less than 50 nm are not possible.

Accordingly, the present disclosure provides a method for reducing the via CD by selectively growing a metal layer on metal hardmask sidewalls before etching the via and trench patterns in the dielectric layer. The via CD can be modulated along the self-aligned via (SAV) direction, and the vias are confined within the metal trenches. Having vias with widths that are smaller than the abutting trenches reduces the via to adjacent metal short concerns. Self-aligned vias having widths of less than 50 nm are formed using the disclosed selective metal growth methods.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

Figure 1A:
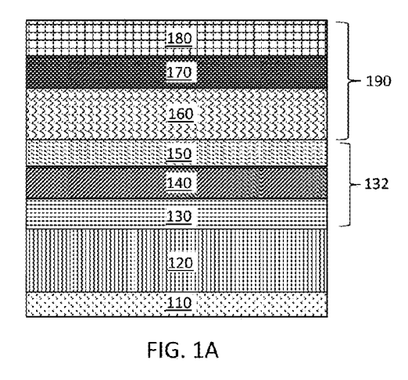
FIG. 1A illustrates a cross-sectional side view of a standard lithographic mask formed over a tri-layer hard mask, and ILD layer, and a metal wiring layer.

Turning now to the Figures, FIGS. 1A-1D illustrate trench patterning according to an exemplary embodiment. FIG. 1A illustrates a cross-sectional side view of a semiconductor stack including a standard lithographic mask 190 over a metal wiring layer 110. An inter-level dielectric (ILD) layer 120 is disposed on the metal wiring layer 110. A tri-layer hard mask 132 is formed over the ILD layer 120. The tri-layer hard mask 132 includes a first insulating layer 130 over the ILD layer 120, a metal layer 140 over the first insulating layer 130, and a second insulating layer 150 over the the metal layer 140. The standard lithographic mask 190 is formed on the tri-layer hard mask 132. The standard lithographic mask 190 includes an organic planarizing layer (OPL) 160, an anti-reflective layer 170, and a photoresist layer 180. The anti-reflective layer 170 can be a silicon anti-reflective layer (SiARC).

The metal wiring layer 110 can include any metal or metal alloy. Non-limiting examples of suitable metals and metal alloys for the metal wiring layer 110 include copper, copper alloys, manganese, manganese alloys, cobalt, cobalt alloys, tungsten, tungsten alloys, or any combination thereof.

The metal wiring layer 110 thickness is not intended to be limited. In one aspect, the metal wiring layer 110 has a thickness in a range from about 10 nm to about 100 nm. In another aspect, the metal wiring layer 110 has a thickness in a range from about 20 nm to about 50 nm. Yet, in another aspect, the metal wiring layer 110 has a thickness about or in any range from about 10, 20, 30, 40, 50, 60, 70, 80, 90, and 100 nm.

The ILD layer 120 can include silicon dioxide, silicon nitride, silicon oxynitride, a metal oxide, a material with a dielectric constant from about 3.0 to about 2.0, glass, or any combination thereof. The ILD layer 120 can be an oxide or a nitride or any dielectric material.

The ILD layer 120 thickness is not intended to be limited. In one aspect, the ILD layer 120 has a thickness in a range from about 10 nm to about 150 nm. In another aspect, the ILD layer 120 has a thickness in a range from about 50 nm to about 100 nm. Yet, in another aspect, the ILD layer 120 has a thickness about or in any range from about 10, 20, 30, 40, 50, 60, 70, 80, 90, 100, 110, 120, 130, 140, and 150 nm.

The first insulating layer 130 and the second insulating layer 150 of the tri-layer hard mask 132 can be any suitable oxide material, oxide precursor material, or nitride material. Non-limiting examples of suitable materials for the first oxide or nitride layer 130 and the second oxide or nitride layer 150 include tetraethyl orthosilicate (TEOS), silicon dioxide, silicon nitride, or any combination thereof. The first insulating layer 130 and the second insulating layer 150 can be the same or different.

The first insulating layer 130 thickness is not intended to be limited. In one aspect, the first insulating layer 130 has a thickness in a range from about 5 nm to about 70 nm. In another aspect, the first insulating layer 130 has a thickness in a range from about 5 nm to about 50 nm. Yet, in another aspect, the first insulating layer 130 has a thickness about or in any range from about 5, 10, 15, 20, 25, 30, 35, 40, 45, 50, 55, 60, 65, and 70 nm.

The second insulating layer 150 thickness is not intended to be limited. In one aspect, the second insulating layer 150 has a thickness in a range from about 5 nm to about 70 nm. In another aspect, the second insulating layer 150 has a thickness in a range from about 5 nm to about 50 nm. Yet, in another aspect, the second insulating layer 150 has a thickness about or in any range from about 5, 10, 15, 20, 25, 30, 35, 40, 45, 50, 55, 60, 65, and 70 nm.

The metal layer 140 can include any metal, metallic compound, or metallic alloy that is conductive. The metal layer 140 can be formed by any suitable method, for example, by physical vapor deposition, chemical vapor deposition, electroplating, or other suitable methods. Non-limiting examples of suitable materials for the metal layer 140 include cobalt, cobalt tungsten phosphorus, ruthenium, titanium, titanium nitride, tantalum, tantalum nitride, tungsten, tungsten nitride, or any combination thereof.

The OPL layer 160, the anti-reflective layer 170, and the photoresist layer 180 are used as a standard lithographic mask 190. The standard lithographic mask 190 is used to pattern the underlying layers. The OPL layer 160 is formed at a predetermined thickness to provide reflectivity and topography control during etching of the second oxide or nitride layer 150 below. The thickness of the OPL layer 160 is in a range from about 50 nm to about 300 nm. The thickness of the anti-reflective layer 170 is in range from about 50 nm to about 200 nm. The thickness of the photoresist 180 is in a range from about 50 nm to about 200 nm.

Figure 1B:
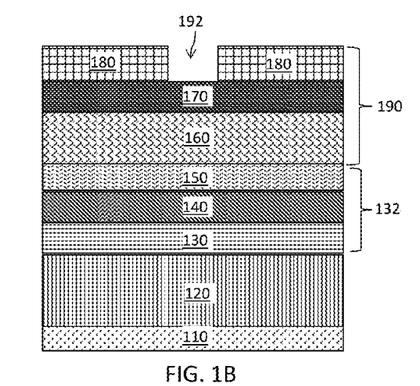
FIG. 1B illustrates a cross-sectional side view after defining a trench pattern in the photoresist layer of the standard lithographic mask of FIG. 1A.

The standard lithographic mask 190 defines a pattern for lithography and etching of the via and the trench, as described below, which will be transferred to the ILD layer 120. Initially, the pattern is defined in the photoresist layer 180 of the standard lithographic mask 190 as shown in FIG. 1B, which illustrates a cross-sectional side view of FIG. 1A after defining the trench pattern 192 in the photoresist layer 180 to form a photomask. Subsequently, the trench pattern 192 is defined in the anti-reflective layer 170 and the OPL layer 160 by lithographically removing portions of the anti-reflective layer 170 and the OPL layer 160 in accordance with the pattern of the photoresist layer 190.

Figure 1C:
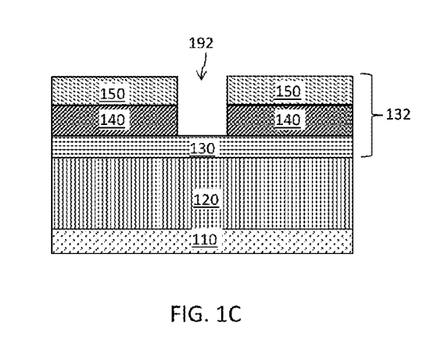
FIG. 1C illustrates a cross-sectional side view after transferring the trench pattern through a metal layer of the tri-layer hard mask and removing the standard lithographic mask of FIG. 1B.
Figure 1D:
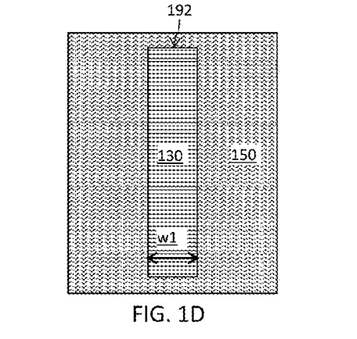
FIG. 1D illustrates a top view of FIG. 1C.

FIG. 1C illustrates a cross-sectional side view of FIG. 1B after defining the trench pattern 192 in accordance with the photoresist layer 180 through the first insulating layer 130 and the metal layer 140. Then the standard lithographic mask 190 is removed. FIG. 1D illustrates a top view of FIG. 1C. The trench pattern 192 is defined in the metal layer 140 and the first insulating layer 150 by etching portions of the layers in accordance with the pattern of the photoresist layer 190. As shown in FIG. 1D, the trench pattern 192 defined through the metal layer 140 exposes the first insulating layer 130 beneath the metal layer 140. The defined trench pattern is substantially parallel to the metal wiring layer 110.

The defined trench pattern has a first width w1. The first width w1 is in a range from about 5 nm to about 50 nm. In another aspect, the first width w1 is in a range from about 10 nm to about 30 nm. Yet, in another aspect, the first width w1 is about or in any range from about 5, 10, 15, 20, 25, 30, 35, 40, 45, and 50 nm.

The trench patterning shown and described in FIGS. 1A-1D is but one embodiment. Other methods of trench patterning may be used to define the trench pattern 192 through the first metal layer 140. Non-limiting examples of methods for patterning the trench include 193 nm immersion lithography, extreme ultraviolet lithography (EUV), or combinations of advanced lithography and non-lithography techniques. In another example, the trench pattern is defined using a sidewall image transfer technique.

Figure 2A:
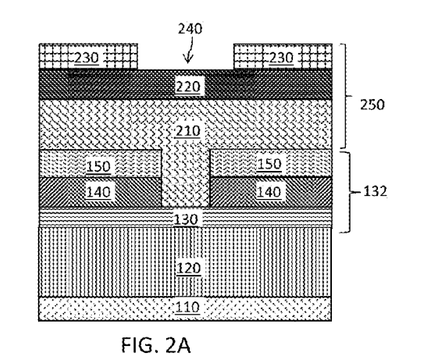
FIG. 2A illustrates a cross-sectional side view of another standard lithographic mask defining a via over the structure in FIG. 1C.
Figure 2B:
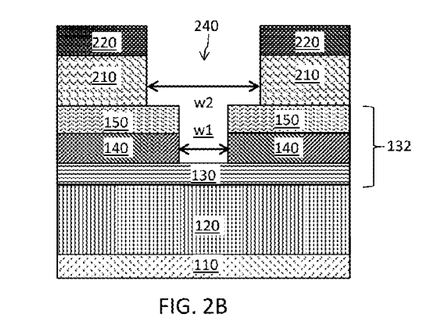
FIG. 2B illustrates a cross-sectional side view of FIG. 2A after transferring the via pattern through the standard lithographic mask and removing the photoresist layer.

FIGS. 2A-2B illustrate via patterning of the semiconductor stacks in FIGS. 1A-1D. FIG. 2A illustrates a cross-sectional side view of FIG. 1C after applying another standard lithographic mask 250 to define a via pattern 240. The standard lithographic mask 250 includes a photoresist layer 240, an anti-reflective layer 220, and an OPL layer 210. The via pattern 240 is initially defined in the photoresist layer 240.

Figure 2C:
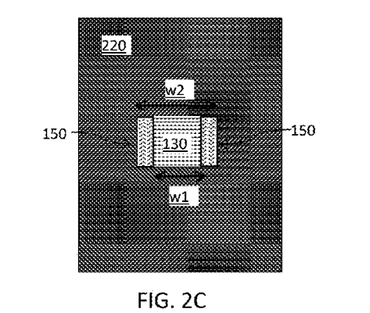
FIG. 2C illustrates a top view of FIG. 2B.

FIG. 2B illustrates a cross-sectional side view of FIG. 2A after transferring the via pattern 240 through the anti-reflective layer 220 and the OPL layer 210 and removing the photoresist layer 230. The via pattern 240 defines a hole abutting and substantially perpendicular to the trench pattern 192. FIG. 2C illustrates a top view of FIG. 2B. The via pattern 240 defined through the standard lithographic mask 250 exposes portions of the second insulating layer 150.

The via pattern 240 is defined by a second width w2. The second width w2 is larger than the first width w1. The second width w2 is in a range from about 25 nm to about 70 nm. In another aspect, the second width w2 is in a range from about 30 nm to about 50 nm. Yet, in another aspect, the second width w2 is about or in any range from about 25, 30, 35, 40, 45, 50, 55, 60, 65, and 70 nm.

The via patterning shown and described in FIGS. 2A-2C is but one embodiment. Other methods of via patterning may be used to define the via pattern 240 through the metal layer 140. Non-limiting examples of methods for patterning the via include 193 nm immersion lithography, EUV lithography, or combinations of advanced lithography and non-lithography techniques. In another example, the via pattern 240 is defined using double patterning through a litho-etch-litho-etch approach.

Figure 3A:
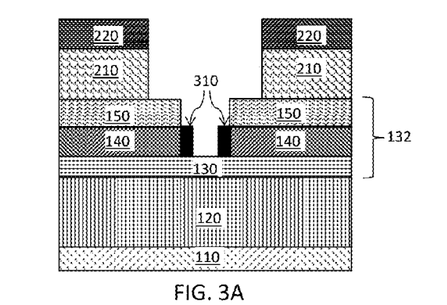
FIG. 3A illustrates a cross-sectional side view of FIG. 2B after selective metal growth on metal side walls of the trench.
Figure 3B:
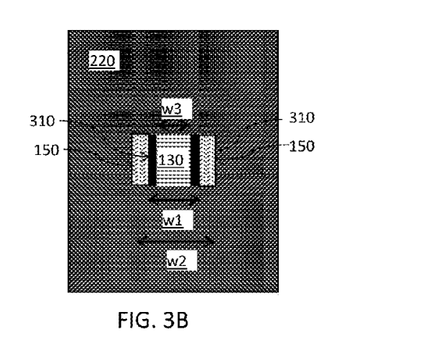
FIG. 3B illustrates a top view of FIG. 3A.

FIGS. 3A-3B illustrate a method for narrowing the via width using a selective metal capping method. FIG. 3A illustrates a cross-sectional side view of FIG. 2B after selective metal growth on metal side walls of the trench. FIG. 3B illustrates a top view of FIG. 3A. A selective metal growth process is used to form a metal capping layer 310 only on the exposed sidewall of the trench pattern. The metal will selectively form a thin layer within the metal layer 140, which forms metal hard mask sidewalls. The metal capping layer 310 decreases the first width w1 of the trench to a third width w3 (see FIG. 3B). The third width w3 of the new (second) via pattern is smaller than both the trench (having first width w1) and initial (first) via pattern having second width w2.

Using the selective metal growth method enables more freedom to manipulate the via CD, without relying on reactive-ion etching (RIE) alone for reducing via critical dimensions. The metal capping layer 310 can be formed by any suitable method. In one exemplary method, chemical vapor deposition (CVD) is used and a metal-organic precursor, such as, dicobalt hexacarbonyl t-butylacetylene (CCTBA), is used for the deposition reaction at a suitable temperature. A deposition temperature in a range from about 150° C. to about 250° C. can be used.

The metal capping layer 310 can include any metal or metal alloy. Non-limiting examples of suitable metals for the capping layer 310 include cobalt, cobalt tungsten phosphorus, ruthenium, titanium, titanium nitride, tantalum, tantalum nitride, tungsten, tungsten nitride, or any combination thereof.

The metal capping layer 310 thickness is not intended to be limited. In one aspect, the metal capping layer 310 has a thickness in a range from about 1 nm to about 10 nm. In another aspect, the metal capping layer 310 has a thickness in a range from about 1 nm to about 5 nm. Yet, in another aspect, the metal capping layer 310 has a thickness about or in any range from about 1, 2, 3, 4, 5, 6, 7, 8, 9, and 10 nm.

The third width w3 defines the new via pattern and provides for a via with a width that is less than the trench, defined by first width w1, and the original via, defined by second width w2. The third width w3 is in a range from about 3 nm to about 48 nm. In another aspect, the third width w3 is in a range from about 8 nm to about 28 nm. Yet, in another aspect, the third width w3 is about or in any range from about 3, 5, 8, 10, 13, 15, 18, 20, 23, 25, 28, 30, 33, 35, 38, 40, 43, 45, and 48 nm.

Figure 4A:
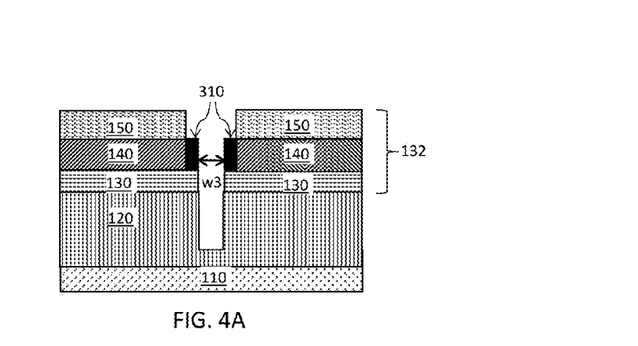
FIG. 4A illustrates a cross-sectional side view of FIG. 3A after via transfer etching into the ILD layer and removing the standard lithographic mask.
Figure 4B:
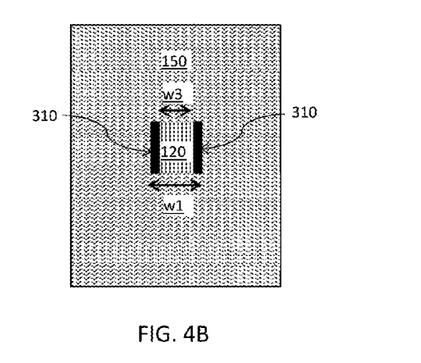
FIG. 4B illustrates a top view of FIG. 4A.
Figure 4C:
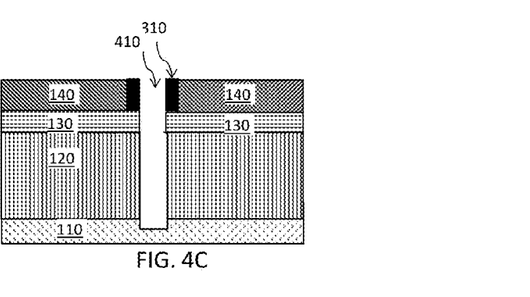
FIG. 4C illustrates a cross-sectional side view of FIG. 4A after removing the first insulating layer of the tri-layer hard mask.

FIG. 4A illustrates a cross-sectional side view of FIG. 3A after transferring the via pattern into the ILD layer 120 and removing the anti-reflective layer 220 and the OPL layer 210. FIG. 4B illustrates a top view of FIG. 4A. The via pattern defined by third width w3 is etched into the ILD layer 120 to transfer the via pattern into the ILD layer 120. FIG. 4C illustrates a cross-sectional side view of FIG. 4A after removing the second insulating layer 150 and further defining the via 410 through the ILD layer 120 and into metal wiring layer 110.

Figure 5A:
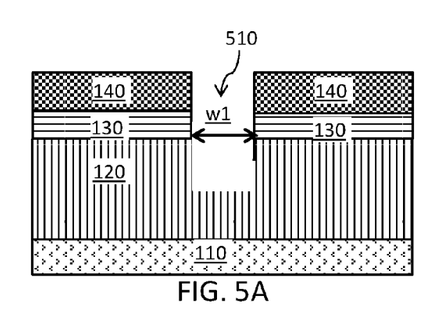
FIG. 5A illustrates a cross-sectional side view of FIG. 4B after trench transfer etching into the ILD layer and removing the first insulating layer of the tri-layer hard mask.
Figure 5B:
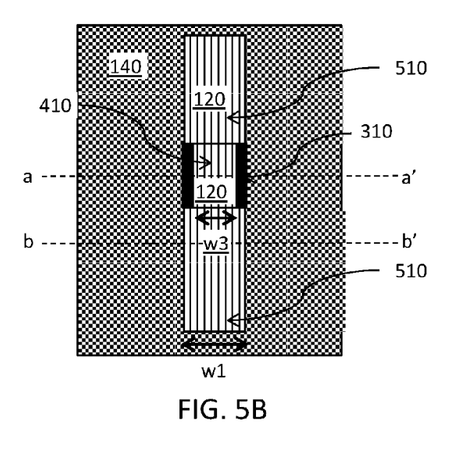
FIG. 5B illustrates a top view of the cross-sections in FIGS. 4C and 5A.

After via transfer etching, the trench pattern is transfer etched into the ILD layer 120. FIG. 5A illustrates a cross-sectional side view after trench transfer etching into the ILD layer 120 shown in FIG. 4B to form the trench 510. In contrast to the via, the trench stops in the ILD layer. FIG. 5B illustrates a top view of the cross-sectional views in FIGS. 4C and 5A along the a-a' axis and the b-b' axis, respectively. The via 410 is substantially perpendicular to the trench 510 and extends into, but not through, the ILD layer 120.

To complete the dual damascene structure, the tri-layer hard mask 132 is removed. A barrier metal layer, for example, tantalum, tantalum nitride, titanium nitride, or titanium tungstate, is deposited to line the via and trench within the dielectric layer. A metal, for example, copper, is then deposited, for example, by electroplating, to fill the via and trench. Initially, a seed layer of copper can be deposited by physical vapor deposition (PVD), and then the copper can be electroplated. The surface is planarized using chemical mechanical planarization (CMP) processes to form the final dual damascene structure. The process can be repeated as needed to form the desired number of wiring levels, after which processing continues as known in the art.

In one embodiment, the trench and the via are filled with a metal, and CMP is performed to form a dual damascene structure comprising an upper wiring layer in selective contact with the lower wiring layer corresponding to locations of the vias.

Figure 6A:
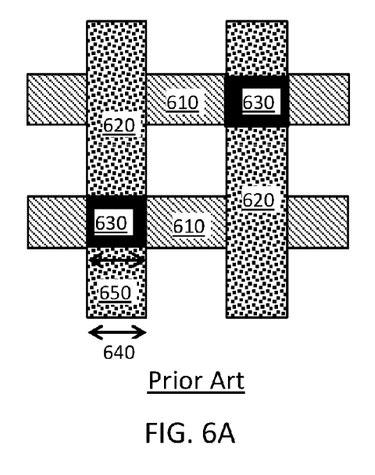
FIG. 6A illustrates a comparative example of a top view of conventional vias having diameters that are substantially the same as the trench diameters.
Figure 6B:
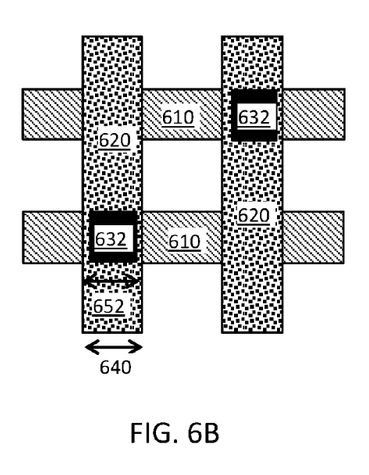
FIG. 6B illustrates a top view of vias formed in accordance with the present disclosure having vias with diameters that are less than the trench diameters.

FIGS. 6A and 6B compare conventional dual damascene structures (FIG. 6A) with dual damascene structures prepared in accordance with the present disclosure (FIG. 6B). FIG. 6A is a comparative example and shows a top view of first metal trenches 610 connected to second metal trenches 620 through vias 630. The width 650 of the vias 630 is substantially the same as the width 640 of the trenches. As shown in FIG. 6B, in accordance with the present disclosure the width 632 of the vias is less than the width 640 of the trench 652. The vias 632 are self-aligned with the trenches 610 and 620.

Example

Figure 7A:
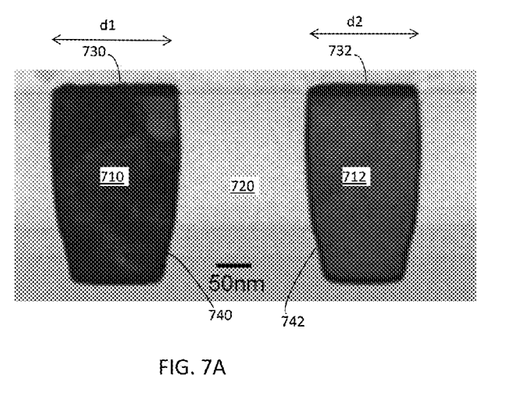
FIG. 7A illustrates a cross-sectional side view of copper trenches with selectively placed metal caps.
Figure 7B:
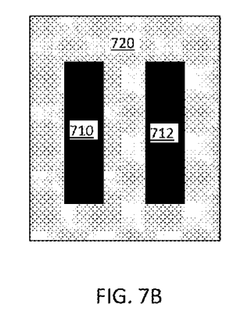
FIG. 7B illustrates a cross-sectional schematic diagram of the copper trenches of FIG. 7A.

FIG. 7A illustrates a cross-sectional side view of copper trenches 710 and 712 within a dielectric 720. FIG. 7B illustrates a top view of the copper trenches of FIG. 7A. Copper trench 710 has a width d1 of about 180 nm, and copper trench 720 has a width d2 of about 160 nm. The copper trenches 710 and 720 have selective metal caps 730 and 732 and Ta(N) liners 740 and 742.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for fabricating a self-aligned via structure, the method comprising:
   forming a tri-layer mask on an inter-level dielectric (ILD) layer, the ILD layer disposed over a lower metal wiring layer, and the tri-layer mask comprising a first insulating layer, a second insulating layer, and a metal layer disposed between the first and second insulating layers;
   defining a trench pattern through the first insulating layer and the metal layer of the tri-layer mask, the trench pattern having a first width;
   defining a first via pattern in a lithographic mask over the trench pattern in the tri-layer mask, the first via pattern having a second width, and the second width being larger than the first width;
   growing a metal capping layer on an exposed sidewall of the trench pattern to decrease the first width of the trench pattern to a third width, the third width defining a second via pattern;
   transferring the trench pattern into the ILD layer to form a trench; and
   transferring the second via pattern through the ILD layer and into the metal wiring layer to form a via.

2. The method of claim 1, wherein the metal capping layer is cobalt, cobalt tungsten phosphorus, ruthenium, titanium, titanium nitride, tantalum, tantalum nitride, tungsten, tungsten nitride, or any combination thereof.

3. The method of claim 1, wherein the lower metal wiring layer is copper.

4. The method of claim 1, wherein the metal capping layer is selectively formed on a portion of the metal layer within the tri-layer mask.

5. The method of claim 1, further comprising removing the tri-layer mask and depositing a barrier metal layer into the trench and the via to form a barrier metal lining.

6. The method of claim 5, further comprising filling the trench and the via with a metal and performing chemical mechanical planarization (CMP) to form a dual damascene structure comprising an upper wiring layer in selective contact with the lower wiring layer corresponding to locations of the vias.

7. The method of claim 6, wherein the metal is copper.

8. The method of claim 1, wherein the metal capping layer has a thickness in a range from about 1 nm to about 10 nanometers (nm) nm.

9. The method of claim 1, wherein the metal layer is cobalt, cobalt tungsten phosphorus, ruthenium, titanium, titanium nitride, tantalum, tantalum nitride, tungsten, tungsten nitride, or any combination thereof.

10. The method of claim 1, wherein the first width is in a range from about 5 nm to about 50 nm, and the second width is in a range from about 25 nm to about 70 nm.

11. The method of claim 1, wherein the third width is in a range from about 3 nm to about 48 nm.

12. A method for fabricating a self-aligned via structure, the method comprising:
    forming a tri-layer hard mask on an ILD layer, the ILD layer is disposed over a metal wiring layer, and the tri-layer hard mask comprises a first insulating layer, a second insulating layer, and a metal layer disposed between the first and second insulating layers;
    forming a lithographic mask on the tri-layer hard mask;
    defining a trench pattern through the first insulating layer and the metal layer of the tri-layer mask, the trench pattern having a first width;
    defining a first via pattern in the lithographic mask over the trench, the first via pattern having a second width, and the second width being larger than the first width;
    growing a metal capping layer selectively on a portion of the metal layer within the trench pattern to decrease the first width to a third width, the third width defining a second via pattern;
    transferring the trench pattern into the ILD layer to form a trench; and
    transferring the second via pattern through the ILD layer and into the metal wiring layer to form a via.

13. The method of claim 12, wherein the via is substantially perpendicular to the trench.

14. The method of claim 12, further comprising removing the tri-layer mask and depositing a barrier metal layer into the trench and the via to form a barrier metal lining.

15. The method of claim 14, further comprising filling the trench and the via with copper and performing CMP to form a dual damascene structure.

* * * * *